United States Patent [19]

Yokoyama

[11] Patent Number: 4,512,008

[45] Date of Patent: Apr. 16, 1985

[54] SMALL SIGNAL AMPLIFYING CIRCUIT FOR A PICKUP CARTRIDGE

[75] Inventor: Kenji Yokoyama, Hamamatsu, Japan

[73] Assignee: Nippon Gakki Seizo Kabushiki Kaisha, Hamamatsu, Japan

[21] Appl. No.: 411,329

[22] Filed: Aug. 25, 1982

[30] Foreign Application Priority Data

Sep. 11, 1981 [JP] Japan .................. 56-135338[U]

[51] Int. Cl.³ .................... G11B 3/00; H03F 3/45
[52] U.S. Cl. .................... 369/134; 330/260; 330/311
[58] Field of Search ............ 369/128, 134, 145, 146; 330/260, 311

[56] References Cited

U.S. PATENT DOCUMENTS

| 3,522,390 | 7/1970 | Wieder | 369/145 |
|---|---|---|---|
| 3,624,315 | 11/1971 | Broce | 369/145 |
| 4,274,058 | 6/1981 | Suzuki | 330/260 |
| 4,293,823 | 10/1981 | Hochberg | 330/260 |
| 4,296,383 | 10/1981 | Jeandot | 330/260 |
| 4,328,573 | 5/1982 | Kurtin | 369/128 |

FOREIGN PATENT DOCUMENTS 120516 9/1979 Japan .................. 369/134

OTHER PUBLICATIONS

G.E. Transistor Manual, ©1969, pp. 111, 115–117.

Primary Examiner—Alan Faber
Attorney, Agent, or Firm—Spensley Horn Jubas & Lubitz

[57] ABSTRACT

A small signal amplifying circuit suitable for use in a system such as a disc player-amplifier system in which metal contact portions such as connectors are used between a signal source and an amplifier. The small signal amplifying circuit according to the invention is an improvement of a circuit which is designed to eliminate distortion caused by the metal contact portions by transmitting a signal in a state in which the signal is superposed on a direct current. The circuit according to the invention includes a first transistor provided in a signal source and a second transistor provided in an amplifier which constitutes a differential amplifier with the first transistor. By negative feeding-back the output of the amplifier to the base of the second transistor, distortion factor, signal-to-noise ratio and stability in characteristics are remarkably improved.

12 Claims, 2 Drawing Figures

SMALL SIGNAL AMPLIFYING CIRCUIT FOR A PICKUP CARTRIDGE

BACKGROUND OF THE INVENTION (a) Field of the invention

This invention relates to a small signal amplifying circuit and, more particularly, a small signal amplifying circuit suitable for use in a system in which metal contact portions such as connectors are used between a signal source and an amplifier.

(b) Description of the prior art

Various connectors using metal contacts are provided in a signal path in a disc player-amplifier system for enabling a listener to change freely a cartridge, a head shell, a tone arm or even an entire player. Since the output signal of a phonocartridge, particularly that of a moving coil type phonocartridge, is a very small signal, this output signal is liable to be affected by variation in electric characteristics of the metal contact portions and, as a result, the signal is transmitted non-linearly accompanied by distortion. If the level of the output signal is relatively large, an oxide-coated layer produced on the surface of the metal contact portion, for instance, will not affect the signal so much owing to dielectric breakdown of the insulation posed by such oxide-coated layer. Such dielectric breakdown, however, cannot be expected in an output level of a moving coil type cartridge, i.e., in the order of several hundred $\mu V$.

A proposal for overcoming such inconvenience has been made in Japanese Patent Preliminary Publication No. Sho 54-120516. This proposal is based on the fact that a non-linear portion in voltage-current characteristic in a metal contact portion exists in the vicinity of 0 voltage in a case where a signal is transmitted through a signal path having the metal contact portion and attempts to transmit the signal by superposing it on a direct current of such a level that the signal will not be affected by the non-linear portion produced by the metal contact portion. Since, however, negative feedback cannot be applied in the circuit which is specifically shown as the embodiment of the disclosed invention in the publication, this circuit is disadvantageous in distortion factor, signal-to-noise ratio, irregularity in gain and stability of characteristics. If mutual conductance gm of a transistor as an amplifying element is increased for improving the signal-to-noise ratio, it will restrict a maximum allowable input level. Further, the irregularity in gain and the stability of characteristics are considered to depend upon properties of active elements so that it will be difficult to ensure a uniform gain and stable characteristics of the circuit in a large scale production of such active elements.

SUMMARY OF THE INVENTION

It is, therefore, an object of the invention to provide a small signal amplifying circuit capable of applying negative feed-back as well as superposing a direct current on the small signal to be transmitted thereby to improve the distortion factor, signal-to-noise ratio and stability in characteristics. According to the invention, negative feed-back can be applied despite the limitation posed on the circuit that signals must be outputted from two terminals per one channel because a system to which the invention is applied includes a stereophonic disc player system which uses a head shell and an arm using a normal 4-terminal connector.

DETAILED DESCRIPTION OF THE PREFERRED EMBODIMENT

Figure 1:
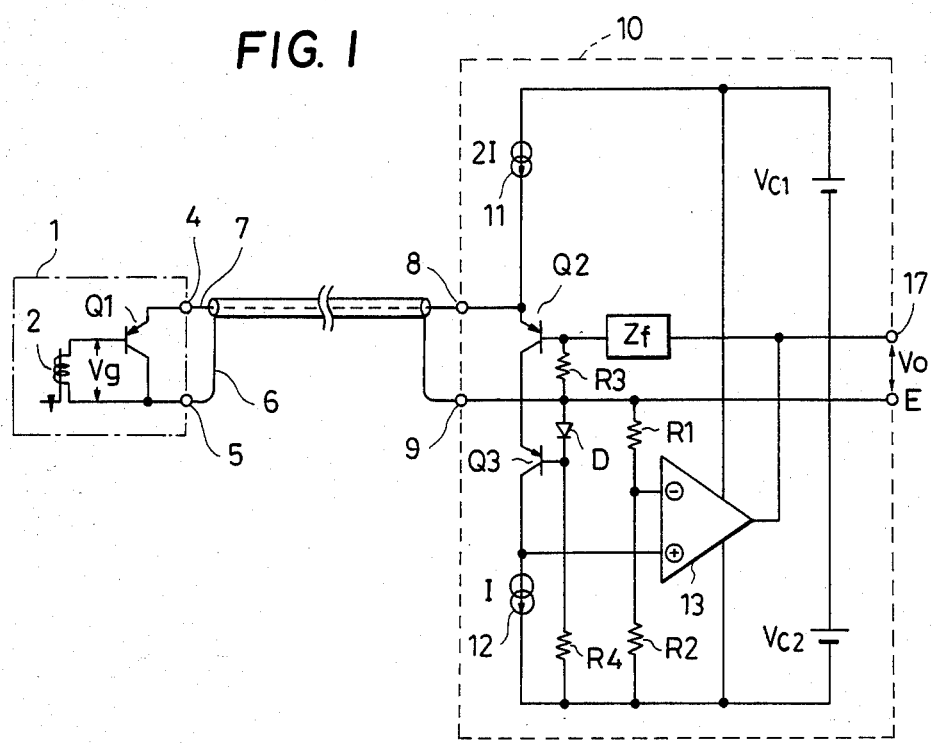
FIG. 1 is a circuit diagram showing an embodiment of the invention.

Referring to FIG. 1, a signal source component 1 provided in a cartridge shall comprises a transistor Q1 and a pick-up cartridge 2 coupled between the base and the collector of the transistor Q1. The transistor Q1 receives an output Vg of the pick-up cartridge 2. The emitter and collector of the transistor Q1 are respectively coupled to output terminals 4 and 5. The output terminal 5 is coupled to ground potential E through a lead wire 6 and an input terminal 9 of an amplifier component 10.

In the amplifier 10, a transistor Q2 constitutes a differential amplifier with the transistor Q1. The emitter of the transistor Q2 is coupled to the emitter of the transistor Q1 through an input terminal 8 and a lead wire 7. The collector of the transistor Q2 is coupled to an output terminal 17 from which an output of the amplifier component 10 is derived. A constant current source 11 is provided for supplying a constant current 2I to these common emitters.

Coupling means coupling the output terminals 4 and 5 to the corresponding input terminals 8 and 9 in the illustrated embodiment includes a shielded wire made of a core which constitutes the lead wire 7 and a sheath which constitutes the lead wire 6. The coupling means also includes connectors having metal contact portions.

A third transistor is cascode connected at its emitter to the collector of the transistor Q2 with its collector coupled to the output terminal 17 and its base to a reference potential of the amplifier component 10 through a diode D. In this embodiment, the reference voltage is a ground potential. A forward voltage of the diode D is applied to the base of the transistor Q3 thereby bringing its emitter voltage to a ground potential and bringing the collector voltage of the transistor Q2 to a ground potential for balancing the operation with the transistor Q1 as the differential amplifier. To the collector of the transistor Q3 is coupled a constant current source 12 for supplying a constant current I.

In a case where an output is to be derived from one of transistors of a differential amplifier (from the side of the transistor Q2 in the present embodiment), the other transistor is normally coupled to a power source. This, however, is equivalent to coupling to the ground if viewed as AC and, accordingly, there is no problem in coupling the collector of the transistor Q1 to the ground potential as in the present embodiment. In this case, a collector-emitter voltage is applied between the base and the emitter when an input is 0, so that the transistors Q1 and Q2 are operated by the collector-emitter voltage of 0.6 V.

An amplifier 13 such as an operational amplifier includes a non-inverting input terminal coupled to the collector of the transistor Q3, an inverting input terminal to which a predetermined reference potential is applied and an output terminal coupled to the output terminal 17. The inverting input terminal is coupled to a junction of resistors R1 and R2 connected in series between a negative terminal of a power supply source $V_{c2}$ having a voltage of Vc and the ground potential. As the reference potential, a voltage obtained by dividing power voltage $-Vc$ by the resistors R1 and R2 is applied to the inverting input terminal whereas a voltage between the collector of the transistor Q3 and the constant current source 12 is applied to the non-inverting input terminal. Resistances of the resistors R1 and R2 are set at such values that an output voltage Vo of the amplifier 13 becomes 0 when no signal is inputted thereto.

An impedance circuit Zf coupled in series between the output terminal 17 and the base of the transistor Q2 and a resistor R3 coupled between the base of the transistor Q2 and the reference potential of the amplifier component 10 constitute a negative feed-back circuit for negative feeding-back the output Vo of the amplifier component 10 to the base of the transistor Q2.

The emitter of the transistor Q2 is coupled to a positive terminal of a power supply source $V_{c1}$ through the constant current source 11 whereby DC biasing of the transistor Q1 is established. The collector of the transistor Q3 and the base of the transistor Q3 are coupled to the negative terminal of the power supply source through the constant current source 12 and through a resistor R4, respectively. A negative terminal of the power supply source $V_{c1}$ and a positive terminal of the power supply source $V_{c2}$ are commonly connected to the ground potential E.

When the output Vg of the pick-up cartridge 2 is 0, current I flows through the collectors of the transistors Q1 and Q2. At this time, the voltage applied to the non-inverting input terminal of the amplifier 13 is equal to the voltage applied to the inverting input terminal and the output voltage Vo thereof is 0.

As the output Vg becomes a positive value, the base of the transistor Q1 is biased in a positive direction so that the collector current of the transistor Q2 tends to increase. Since, however, the collector current is regulated by the constant current source 12, the balance is maintained by increasing the output of the amplifier 13 by increasing the voltage at the non-inverting input terminal and thereby increasing the base voltage of the transistor Q2. Accordingly, a voltage corresponding to the signal Vg appears as the output Vo at this time.

When the output Vg becomes a negative value, the base of the transistor Q1 is biased in a negative direction so that the collector current of the transistor Q2 tends to decrease. Since, however, the collector current is regulated by the constant current source 12, the balance is maintained by decreasing the output of the amplifier 13 by decreasing the voltage at the non-inverting input terminal and thereby decreasing the base voltage of the transistor Q2. Accordingly, a voltage corresponding to the signal Vg appears as the output Vo.

According to the invention, the signal from the signal source component 1 passes the metal contact portions in the coupling means (the connectors provided at the output terminals 4, 5 and the input terminals 8, 9) in a state in which the signal is superposed on a direct current in the same manner as in the invention disclosed in Japanese Patent Preliminary Publication No. Sho 54-120516 so that distortion produced in passing the metal contact portions can be eliminated. Besides, since negative feed-back is applied, the gain Gv is determined by the negative feed-back resistances (i.e., $Gv = Vo/Vg = 1 + Zf/R3$ in the present embodiment) and therefore can be easily set. Further, characteristics of transistors constituting the differential amplifier to be selected are not so critical and, accordingly, the manufacturing cost can be saved.

Figure 2:
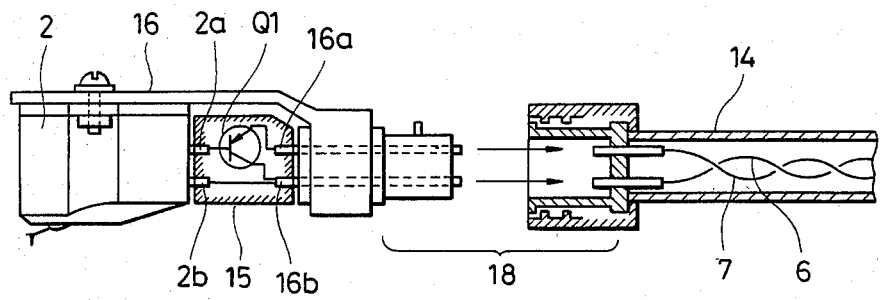
FIG. 2 is a view showing a state in which a transistor Q1 shown in FIG. 1 is incorporated in cartridge shell.

In mounting the transistor Q1 to the cartridge shell, the transistor Q1 may be composed as a component part incorporated in an adaptor 15 as shown in FIG. 2 and this component part may be fitted to connectors 16a, 16b of a cartridge shell 16 connected to a tone arm 14 through connectors 18 and also to output connectors 2a, 2b of a pick-up cartridge 2.

The above embodiment has been described about a case where a phonocartridge is coupled to an amplifier. The invention is applicable also to other signal transmission paths where a small signal must be transmitted through metal contact portions such, for example, as a signal path of a signal from a reproducing head of a tape recorder.

What is claimed is:

1. A small signal amplifying circuit comprising:
   a signal source component including a pickup cartridge as a signal source, a first transistor having a base, an emitter and a collector, said signal source being coupled between said base and said collector, and first and second output terminals respectively coupled to said emitter and said collector;
   an amplifier component including first and second input terminals, said second input terminal being coupled to a reference potential of said amplifier component, a third output terminal from which an output of said amplifier component produced by amplifying a signal from said signal source is derived, and a second transistor having a base, an emitter and a collector and constituting a differential amplifier of an input stage voltage amplifier together with said first transistor, said emitter of said second transistor being coupled to said first input terminal and said collector of said second transistor being coupled to said third output terminal;
   the emitter of said second transistor of said amplifier component being supplied with a DC bias current to provide DC biasing of said first transistor; and
   coupling means having metal contact portions and comprising lead wires for respectively coupling said first output terminal to said first input terminal and said second output terminal to said second input terminal;
   said metal contact portions being detachable to break connections between the first output and first input terminals and between the second output and second input terminals.

2. A small signal amplifying circuit as defined in claim 1 wherein said amplifier component further comprises negative feed-back circuit means for negative feeding-back the output of said amplifier component to said base of said second transistor.

3. A small signal amplifying circuit as defined in claim 2 wherein said amplifier component further comprises a third transistor having an emitter, a collector and a base and being cascode-connected to the collector side of said second transistor, the emitter of said third transistor being coupled to the collector of said second transistor, the collector of said third transistor being coupled to said third output terminal and the base of said third transistor being coupled to the reference potential of said amplifier component through a diode, the output of said amplifier component being derived from the collector of said third transistor.

4. A small signal amplifying circuit as defined in claim 3 wherein said amplifier component further comprises an amplifier having a non-inverting input terminal coupled to the collector of said third transistor, an inverting input terminal to which a predetermined reference potential is applied and an output terminal coupled to said third output terminal.

5. A small signal amplifying circuit as defined in claim 4 wherein said negative feed-back circuit means of said amplifier component comprises an impedance circuit coupled in series between said third output terminal and the base of said second transistor and resistor means coupled between the base of said second transistor and the reference potential of said amplifier component.

6. A small signal amplifying circuit as defined in claim 5 wherein said reference potential of said amplifier component is a ground potential.

7. A small signal amplifying circuit as defined in claim 6 wherein the emitter of said second transistor is coupled to a positive power supply terminal through a first constant current source, the collector of said third transistor is coupled to a negative power supply terminal through a second constant current source, the inverting input terminal of said amplifier is coupled to a junction of resistors connected in series between the negative power supply terminal and the ground potential and supplied with a reference potential, and the base of said third transistor is coupled to the negative power supply terminal through a resistor.

8. A small signal amplifying circuit as defined in anyone of claims 1, 2 and 3 wherein said signal source component relates disposed to a pick-up for a disc player and said first transistor is in a head shell portion in proximity to a pick-up transducer.

9. A small signal amplifying circuit as defined in claim 8 wherein said coupling means comprises lead wires respectively coupling said first output terminal to said first input terminal and said second output terminal to said second input terminal.

10. A small signal amplifying circuit as defined in claim 9 wherein said lead wires are made of a shielded wire composed of a core and a sheath, said core coupling said first output terminal to said first input terminal and said sheath coupling said second output terminal to said second input terminal.

11. A small signal amplifying circuit as defined in claim 10 wherein said signal source component comprises a magnetic-electric transducing element.

12. A small signal amplifying circuit as defined in claim 11 wherein said magnetic-electric transducing element is a moving coil type mechanical-electric transducer.

* * * * *

UNITED STATES PATENT AND TRADEMARK OFFICE
CERTIFICATE OF CORRECTION

PATENT NO. : 4,512,008
DATED : Apr. 16, 1985
INVENTOR(S) : Kenji Yokoyama

It is certified that error appears in the above-identified patent and that said Letters Patent is hereby corrected as shown below:

Claim 8, line 2, change "3" to --3-7--;

line 3, delete "disposed";

line 4, after "is" insert --disposed--.

Signed and Sealed this

Twenty-second Day of October 1985

[SEAL]

Attest:

DONALD J. QUIGG

Attesting Officer

Commissioner of Patents and
Trademarks—Designate